(12) United States Patent
Tierney et al.

(10) Patent No.: US 7,531,831 B2
(45) Date of Patent: May 12, 2009

(54) ELECTROLUMINESCENT DEVICE COMPRISING A CROSS-LINKED HOLE TRANSPORTING AND ELECTRON BLOCKING MATERIAL

(75) Inventors: Brian Tierney, Cambridgeshire (GB); Ilaria Grizzi, Cambridge (GB); Clare Foden, Cambridge (GB); Nalin Patel, Cambridge (GB); Mark Leadbeater, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 10/549,462

(22) PCT Filed: Mar. 19, 2004

(86) PCT No.: PCT/GB2004/001209

§ 371 (c)(1),
(2), (4) Date: Aug. 8, 2006

(87) PCT Pub. No.: WO2004/084260

PCT Pub. Date: Sep. 30, 2004

(65) Prior Publication Data

US 2007/0034859 A1    Feb. 15, 2007

(30) Foreign Application Priority Data

Mar. 20, 2003    (GB)    ................... 0306409.4

(51) Int. Cl.
*H01L 35/24*    (2006.01)
*H01L 51/00*    (2006.01)
(52) U.S. Cl. .................. 257/40; 257/E51.051
(58) Field of Classification Search ........... 257/40, 257/E51.018, E51.026
See application file for complete search history.

(56) References Cited

U.S. PATENT DOCUMENTS

| | | | |
|---|---|---|---|
| 4,539,507 A | | 9/1985 | VanSllyke et al. |
| 4,769,292 A | * | 9/1988 | Tang et al. .................. 428/690 |
| 5,629,389 A | * | 5/1997 | Roitman et al. ............. 525/534 |
| 5,723,873 A | | 3/1998 | Yang |
| 5,734,225 A | | 3/1998 | Biebuyck et al. |
| 5,798,170 A | | 8/1998 | Zhang et al. |
| 5,998,045 A | * | 12/1999 | Chen et al. .................. 428/690 |
| 6,107,452 A | | 8/2000 | Miller et al. |
| 6,249,085 B1 | * | 6/2001 | Arai ........................... 313/506 |

(Continued)

FOREIGN PATENT DOCUMENTS

EP    1 003 354 A1    5/2000

(Continued)

OTHER PUBLICATIONS

Office action in corresponding Korean Application No. 2005-7017328, dated Oct. 27, 2006.

(Continued)

*Primary Examiner*—Jerome Jackson, Jr.
*Assistant Examiner*—Anthony Ho
(74) *Attorney, Agent, or Firm*—Marshall, Gerstein & Borun LLP (57) ABSTRACT

An optical device comprising an anode, a cathode comprising barium, strontium or calcium, and a layer of organic semiconducting material between the anode and the cathode wherein a layer of hole transporting and electron blocking material is located between the anode and the layer of organic semiconducting material.

20 Claims, 4 Drawing Sheets

U.S. PATENT DOCUMENTS

| | | |
|---|---|---|
| 6,268,695 B1 | 7/2001 | Affinito |
| 6,353,083 B1 | 3/2002 | Inbasekaran et al. |
| 2001/0026878 A1 | 10/2001 | Woo et al. |
| 2002/0057051 A1 | 5/2002 | Kobayashi |
| 2003/0170494 A1 | 9/2003 | Nii |

FOREIGN PATENT DOCUMENTS

| | | |
|---|---|---|
| EP | 0 776 147 B1 | 8/2001 |
| EP | 1 220 341 A2 | 7/2002 |
| EP | 0 901 176 B1 | 10/2003 |
| EP | 0 949 850 B1 | 8/2004 |
| GB | 2 348 316 A | 9/2000 |
| JP | 09283281 | 10/1997 |
| JP | 2000-351965 | 12/2000 |
| WO | WO 90/13148 | 11/1990 |
| WO | WO 94/03030 | 2/1994 |
| WO | WO 96/16449 | 5/1996 |
| WO | WO 98/05187 | 2/1998 |
| WO | WO 98/57381 | 12/1998 |
| WO | WO 99/21935 | 5/1999 |
| WO | WO 99/48160 | 9/1999 |
| WO | WO 99/54385 | 10/1999 |
| WO | WO 00/46321 | 8/2000 |
| WO | WO 00/48321 | 8/2000 |
| WO | WO 00/53656 | 9/2000 |
| WO | WO 00/55927 | 9/2000 |
| WO | WO 01/19142 A1 | 3/2001 |
| WO | WO 01/62869 A1 | 8/2001 |
| WO | WO 01/81649 A1 | 11/2001 |
| WO | WO 02/31896 A2 | 4/2002 |
| WO | WO 02/031896 A3 | 4/2002 |
| WO | WO 02/084759 A1 | 10/2002 |
| WO | WO 03/019696 A2 | 3/2003 |

OTHER PUBLICATIONS

*Written Opinion of the International Searching Authority*, corresponding to International Patent Application Serial No. PCT/GB2004/001209, European Patent Office, dated Sep. 20, 2004, 6 pages.

*International Search Report*, corresponding to International Patent Application Serial No. PCT/GB2004/001209, European Patent Office, dated Sep. 20, 2004, 5 pages.

*Combined Search and Examination Report under Sections 17 and 18*(3), corresponding to United Kingdom Patent Application Serial No. GB 0306409.4, The Patent Office of Great Britain, dated Sep. 23, 2003, 7 pages.

M. Kreyenschmidt et al., "*Thermally Stable Bue-Light-Emitting Copolymers of Poly( alkyfluorene)*", American Chemical Society, Macromolecules 1998, 31, 1099-1103.

Kobayaski et al., "*A novel RGB multicolor light-emitting polymer display*", Elsevier Science S.A., Synthetic Metals 111-112 (2000) 125-128.

Yu-Hua Niu et al., *Thermal annealing below the glass transition temperature: A general way to increase performance of light-emitting diodes based on copolyfluorenes*, American Institute of Physics, Applied Physics Letters, vol. 81, No. 4, Jul. 22, 2002, pp. 634-636.

Wang et al., "Novel Light-Emitting Devices Based On Pyridine-Containing Conjugated Polymers," IEEE Transactions On Electron Devices, vol. 44, No. 8, Aug. 1997, pp. 1263-1628.

Bernius et al., "*Progress.with Light-Emitting Polymers*," Advanced Materials, 2000 12(23), pp. 1737-1750.

\* cited by examiner

ELECTROLUMINESCENT DEVICE COMPRISING A CROSS-LINKED HOLE TRANSPORTING AND ELECTRON BLOCKING MATERIAL

This is the U.S. national phase of International Application No. PCT/GB2004/001209 filed Mar. 19, 2004, the entire disclosure of which is incorporated herein by reference.

FIELD OF THE INVENTION

The invention relates to organic optical devices, in particular organic electroluminescent and photovoltaic devices.

BACKGROUND OF THE INVENTION

One class of opto-electrical devices is that using an organic material for light emission (an organic light emitting device or "OLED") or as the active component of a photocell or photodetector (a "photovoltaic" device). The basic structure of these devices is a semiconducting organic layer sandwiched between a cathode for injecting or accepting negative charge carriers (electrons) and an anode for injecting or accepting positive charge carriers (holes) into the organic layer.

In an organic electroluminescent device, electrons and holes are injected into the semiconducting organic layer where they combine in to generate excitons that undergo radiative decay. In WO 90/13148 the organic light-emissive material is a polymer, namely poly (p-phenylenevinylene) ("PPV"). Other light emitting polymers known in the art include polyfluorenes and polyphenylenes. In U.S. Pat. No. 4,539,507 the organic light-emissive material is of the class known as small molecule materials, such as (8-hydroxyquinoline) aluminium ("Alq$_3$"). WO 99/21935 discloses the class of materials known as dendrimers. In a practical device one of the electrodes is transparent, to allow photons to escape the device.

A organic photovoltaic device has the same construction as an organic electroluminescent device, however charge is separated rather than combined as described in, for example, WO 96/16449.

One feature of OLED architecture that has attracted considerable research is the selection of the cathode. Factors to be taken into account in selecting a cathode include (a) the workfunction of the cathode relative to the lowest unoccupied molecular orbital (LUMO) of the emissive material and (b) the possibility of the cathode degrading the organic material or vice versa. It will therefore be apparent that selection of the appropriate cathode for a given material is not straightforward, and is yet further complicated when the cathode is required to be compatible with all three of a red, green and blue electroluminescent material as per a full color OLED. For example, Synthetic Metals 111-112 (2000), 125-128 discloses a full color display wherein the cathode is LiF/Ca/Al. The present inventors have found that this cathode is particularly efficacious with respect to the blue emissive material but which shows poor performance with respect to green and, especially, red emitters. For this cathode, the present inventors have found a particular problem of degradation in green and red efficiency when pixels of these color are not driven which is believed to be due to migration of lithium into the electroluminescent material.

Some attention has been directed towards cathodes comprising barium. For example cathodes comprising elemental barium are disclosed in WO 98/57381, Appl. Phys. Lett. 2002, 81(4), 634 and WO 02/84759, and cathodes comprising barium fluoride are disclosed in Appl. Phys. Lett. 2001, 79(5), 2001 and in the applicant's co-pending application PCT GB02/03882. However, barium containing cathodes still have drawbacks. In particular, the workfunction of barium is relatively high which makes injection of electrons into the LUMO of the typical blue electroluminescent material energetically unfavourable. Thus, barium is a relatively inefficient electron injector for blue electroluminescent materials at least.

It is therefore an object of the invention to provide an organic optical device wherein the cathode comprises a relatively high workfunction metal, but has improved performance, in particular improved lifetime (i.e. the time taken for the brightness of the device to decay to half its original brightness at a fixed current) and improved efficiency, as compared to prior art devices with cathodes comprising barium.

GENERAL DESCRIPTION

The present inventors have surprisingly found that the combination of a cathode comprising a relatively high workfunction metal such as barium and a hole transporting / electron blocking layer results in an improvement in both lifetime and efficiency for OLEDs across the range of colors.

Barium has a workfunction (wf) of 2.7 eV; strontium has a wf of 2.59 eV; and calcium has a wf of 2.87 eV (source: J. Appl. Phys. 48(11) 1997, 4730.)

Accordingly, in a first aspect the invention provides an optical device comprising
  an anode
  a cathode comprising barium, strontium or calcium; and
  a layer of organic semiconducting material between the anode and the cathode wherein a layer of hole transporting and electron blocking material is located between the anode and the layer of organic semiconducting material.

Preferably, the cathode comprises barium, more preferably elemental barium.

Alternatively, the cathode may comprise a barium compound such as barium fluoride.

Preferably, the optical device is an electroluminescent device, more preferably a full color electroluminescent device wherein the layer of organic semiconducting material comprises red, green and blue electroluminescent materials.

Preferably, the layer of hole transporting and electron blocking material comprises a triarylamine. More preferably, the triarylamine is provided as repeat units of a polymer. In this case, the polymer is preferably a copolymer having one or more arylene co-repeat units. Preferred co-repeat units are selected from optionally substituted fluorene, spirofluorene, indenofluorene and phenylene, more preferably 9,9-disubstituted fluorene-2,7-diyl.

Where the triarylamine is a repeat unit of a polymer, it is preferably selected from repeat units of formulae 1-6:

1 wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are $C_{1-10}$ alkyl. The repeat unit of formula 1 is most preferred.

Preferably, the layer of organic semiconducting material is a semiconducting polymer, more preferably a semiconducting copolymer.

Where the organic semiconducting material is a copolymer, preferred repeat units are selected from optionally substituted fluorene, spirofluorene, indenofluorene and phenylene, more preferably 9,9-disubstituted fluorene-2,7-diyl. Preferred 9-substituents are optionally substituted alkyl and aryl.

Triarylamines of formulae 1-6 are preferred repeat units for the semiconducting copolymer, most preferably in combination with the repeat units identified in the preceding paragraph.

One particularly preferred triarylamine repeat unit is an optionally substituted repeat unit of formula (I):

wherein each R is independently selected from the group consisting of H or optionally substituted, branched or linear alkyl, aryl, perfluoroalkyl, thioalkyl, cyano, alkoxy, heteroaryl, alkylaryl and arylalkyl groups. Preferably, each R is a $C_{1-10}$ alkyl. Yet more preferably, each R is butyl, most preferably n-butyl.

Where the organic semiconducting material is a copolymer comprising triarylamine repeat units, the present inventors have surprisingly found that device performance is improved at lower molar ratios of the triarylamine repeat unit. Therefore, the molar ratio of triarylamine in such copolymers is preferably less than or equal to 50%, more preferably less than or equal to 30% and most preferably 1-10%.

Preferably, a layer of hole injecting material is located between the anode and the layer of hole transporting and electron blocking material. The hole injecting material is preferably a polymer, more preferably poly(ethylene dioxythiophene).

Preferably, the cathode comprises a first layer in contact with the organic semiconducting layer comprising elemental barium, strontium or calcium and a second layer comprising an inert metal. Preferably, the inert metal is silver, aluminium or gold.

In a second aspect, the invention provides a method of forming an optical device comprising
  providing a substrate comprising an anode;
  depositing a layer of hole transporting and electron blocking material onto the anode;
  depositing a layer of organic semiconducting material over the layer of hole transporting and electron blocking material; and
  depositing a cathode comprising barium, strontium or calcium over the layer of organic semiconducting material Preferably, a layer of hole injecting material is deposited between the anode and the layer of hole transporting and electron blocking material.

The present inventors have surprisingly found that solution deposition of the soluble hole transporting and electron blocking material produces a layer that is at least partially resistant to dissolution, in particular resistant to dissolution when the organic semiconducting material is deposited from a solution using a solvent that the hole transporting and electron blocking material is otherwise soluble in. This resistance to dissolution enables the organic semiconducting material to be deposited from solution without completely intermixing with the hole transporting and electron blocking layer. The present inventors have found that this resistance to dissolution is obtained (a) regardless of whether a PEDT/PSS layer is used or not and (b) when the hole transporting and electron blocking material is deposited in air or in a nitrogen only environment.

Therefore, the layer of hole transporting and electron blocking material and the layer of organic semiconducting material are both preferably deposited from solution. In this case, both the layer of hole transporting and electron blocking material and the layer of organic semiconducting material are preferably polymers.

The resistance of the hole transporting and electron blocking material to dissolution may be increased by heat treatment of the layer following deposition. Therefore, when the layer of hole transporting and electron blocking material and the layer of organic semiconducting material are both deposited from solution, it is preferred that the hole transporting and electron blocking layer is subjected to heat treatment prior to deposition of the organic semiconducting material. Preferably, the heat treatment is below the glass transition temperature (Tg) of the hole transporting and electron blocking material. Preferably, the organic semiconducting material is substantially free of cross-linkable vinyl or ethynyl groups.

By "red electroluminescent material" is meant an organic material that by electroluminescence emits radiation having a wavelength in the range of 600-750 nm, preferably 600-700 nm, more preferably 610-650 nm and most preferably having an emission peak around 650-660 nm.

By "green electroluminescent material" is meant an organic material that by electroluminescence emits radiation having a wavelength in the range of 510-580 nm, preferably 510-570 nm.

By "blue electroluminescent material" is meant an organic material that by electroluminescence emits radiation having a wavelength in the range of 400-500 nm, more preferably 430-500 nm.

BRIEF DESCRIPTION OF THE DRAWINGS

The present invention will now be described in further detail, by way of example only, with reference to the accompanying drawings in which.

DETAILED DESCRIPTION OF THE INVENTION

Figure 1:
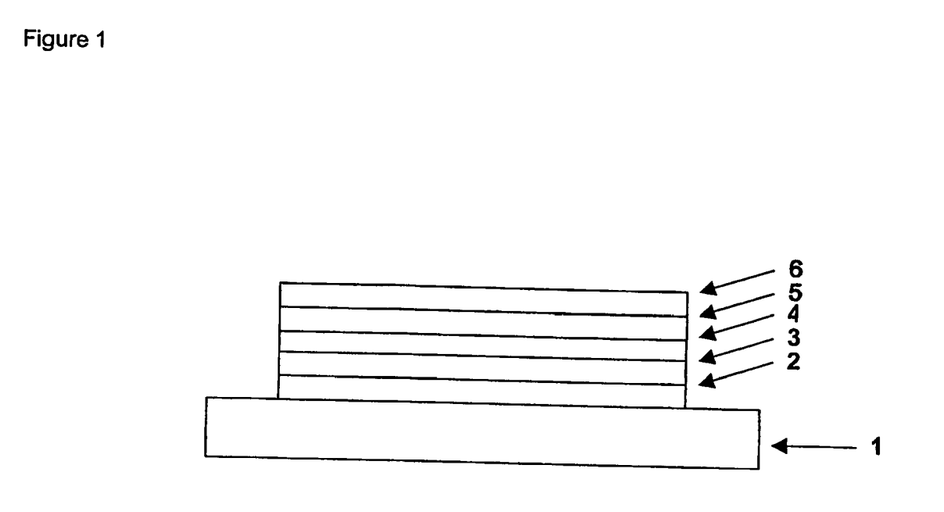
FIG. 1 shows an electroluminescent device according to the invention

With reference to FIG. 1, a PLED or photovoltaic device according to the invention comprises a substrate 1, an anode 2 of indium tin oxide, a layer 3 of organic hole injection material, a layer 4 of hole transporting and electron blocking material, a layer 5 of organic semiconducting material and a cathode 6.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

Although not essential, the presence of layer 3 of organic hole injection material is desirable as it assists hole injection from the anode into the layer or layers of semiconducting polymer. Examples of organic hole injection materials include poly(ethylene dioxythiophene) (PEDT/PSS) as disclosed in EP 0901176 and EP 0947123, or polyaniline as disclosed in U.S. Pat. No. 5,723,873 and U.S. Pat. No. 5,798,170.

Cathode 6 comprises a layer containing barium. This layer may consist solely of barium or it may comprise barium and another material, for example an alloy comprising barium. As an alternative to elemental barium, cathode 6 may comprise a layer containing a dielectric barium salt, in particular barium fluoride as disclosed in Appl. Phys. Lett. 2001, 79(5), 2001.

Cathode 6 may also comprise a capping layer of a relatively inert material over the layer containing barium. Suitable inert materials include silver, gold and aluminium.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142.

In a practical device, at least one of the electrodes is semi-transparent in order that light may be absorbed (in the case of a photoresponsive device) or emitted (in the case of a PLED). Where the anode is transparent, it typically comprises indium tin oxide. Examples of transparent cathodes are disclosed in, for example, GB 2348316. An example of a transparent, barium containing cathode comprises a bilayer of barium and gold.

A typical electroluminescent device comprises an anode having a workfunction of 4.8 eV. Accordingly, a suitable HOMO level for hole transport by the hole transporting electron blocking material of layer 4 for is preferably around 4.8-5.5 eV. The LUMO level of the hole transporting electron blocking material of layer 4 for electron blocking functionality is preferably shallower (i.e. less positive) than the material of layer 5 possessing the deepest (i.e. most positive) LUMO level, and is more preferably about 1.6-2.3 eV.

The hole transporting and electron blocking layer may be a triarylamine-containing small molecule, dendrimer, homopolymer or copolymer. For example, fluorene-triarylamine copolymers are disclosed in WO 99/54385. Another material suitable for use as hole transporting and electron blocking layer 4 is poly(vinyl carbazole) as disclosed in, for example, IEEE Transactions on Electron Devices, 1997, 44(8), 1263-1268.

The organic semiconducting material used to form layer 5 may be a fluorescent small molecule, dendrimer or polymer. The layer 5 may alternatively comprise a phosphorescent material doped into a host material.

Suitable polymers for use as layer 5 include poly(arylene vinylenes) such as poly(p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein.

Polyarylenes as described above may conveniently be formed by Suzuki polymerisation as disclosed in, for example, WO 00/53656 and Yamamoto polymerisation as disclosed in, for example, "Macromolecules", 31, 1099-1103 (1998). Suzuki polymerisation entails the coupling of halide and boron derivative functional groups; Yamamoto polymerisation entails the coupling of halide functional groups. Accordingly, it is preferred that each monomer is provided with two reactive functional groups wherein each functional group is independently selected from the group consisting of (a) boron derivative functional groups selected from boronic acid groups, boronic ester groups and borane groups and (b) halide functional groups.

The aforementioned polyarylenes may comprise further repeat units such as hole transporting repeat units 1-6 described above or heteroaryl repeat units. Particularly preferred heteroaryl repeat units include units of formulae 7-21:

7 wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

Further suitable arylene repeat units are known in this art, for example as disclosed in WO 00/55927 and WO 00/46321, the contents of which are incorporated herein by reference.

A single polymer or a plurality of polymers may be deposited from solution to form layer 5. Suitable solvents for polyarylenes, in particular polyfluorenes, include mono- or polyalkylbenzenes such as toluene and xylene. Where a plurality of polymers are deposited, they may comprise a blend of at least two of a hole transporting polymer, an electron transporting polymer and, where the device is a PLED, an emissive polymer as disclosed in WO 99/48160. Alternatively, layer 5 may be formed from a single polymer that comprises regions selected from two or more of hole transporting regions, electron transporting regions and emissive regions as disclosed in, for example, WO 00/55927 and U.S. Pat. No. 6,353,083. Each of the functions of hole transport, electron transport and emission may be provided by separate polymers or separate regions of a single polymer. Alternatively, more than one function may be performed by a single region or polymer. In particular, a single polymer or region may be capable of both charge transport and emission. Each region may comprise a single repeat unit, e.g. a triarylamine repeat unit may be a hole transporting region. Alternatively, each region may be a chain of repeat units, such as a chain of polyfluorene units as an electron transporting region. The different regions within such a polymer may be provided along the polymer backbone, as per U.S. Pat. No. 6,353,083, or as groups pendant from the polymer backbone as per WO 01/62869. In view of the hole transporting and electron blocking properties of layer 4, such properties may optionally be excluded from the polymer or polymers comprising layer 5.

Layers 4 and 5 may be formed by any process for forming multiple layers in organic optical devices. It is desirable to minimise intermixing of layers 4 and 5; in the case of small molecules, this is straightforward because each layer is typically deposited by evaporation under vacuum. In contrast, dendrimers and polymers are typically deposited from solution and so it is desirable to employ a technique to prevent intermixing when layer 5 is deposited from solution onto a solution deposited layer 4. One technique for preventing intermixing of multiple solution deposited layers is the heat treatment step described in the second aspect of the invention, however other techniques are known. For example IEEE Transactions on Electron Devices, 1997, 44(8), 1263-1268, describes solution deposition of two materials that require different solvents, i.e. the solvent used to deposit the second layer of a multilayer does not dissolve the underlying layer. Another technique disclosed in, for example, WO 94/03030 is to use an insoluble PPV as the first layer by depositing a soluble "precursor" polymer and then heating it to form the insoluble PPV onto which a further layer may be deposited from solution. Yet another technique disclosed in, for example, U.S. Pat. No. 6,107,452, is to deposit from solution a layer of material comprising cross-linkable groups and then treating the layer under cross-linking conditions, e.g. heat or UV treatment, to form a layer of insoluble material onto which a further layer may be deposited from solution. The material may be a monomer or a polymer comprising cross-linkable groups.

The optical device prepared according to the method of the invention is preferably a PLED when the first and second electrodes inject charge carriers. In this case, layer 5 is a light emitting layer.

The optical device is preferably a photovoltaic device or photodetector when the first and second electrodes accept charge carriers. In this case, layer 5 comprises a material capable of electron transport.

Electroluminescent devices may be monochrome, multi-color or full color. Processes for production of monochrome displays include spin coating and dip-coating. Processes for production of full color displays include inkjet printing as described in, for example, EP 0880303 and laser induced thermal imaging as disclosed in, for example, EP 1003354.

EXAMPLES

General Procedure

The invention is exemplified here using the polymer "F8-TFB", illustrated below and disclosed in WO 99/54385, as the hole transporting and electron blocking material.

"F8-TFB"

The general procedure follows the steps outlined below:
1) Depositing PEDT/PSS, available from Bayer® as Baytron P® onto indium tin oxide supported on a glass substrate (available from Applied Films, Colorado, USA) by spin coating.
2) Depositing F8-TFB is by spin coating from xylene solution having a concentration of 2% w/v.
3) Optionally heating the device at 180° C. for 1 hour.
4) Optionally spin-rinsing the substrate in xylene to remove any remaining soluble F8-TFB
5) Depositing a layer of semiconducting polymer by spin-coating from xylene solution to a thickness of around 750 Å.
6) Depositing by evaporation over the semiconducting polymer a cathode consisting of a first layer of barium metal in contact with the semiconducting polymer and a capping layer of aluminium over the layer of barium metal.

7) Encapsulation of the device using an airtight metal container as described in EP 0776147.

Example 1

Blue Electroluminescent Device

The general procedure above was followed, including optional step 3 but excluding optional step 4. The organic semiconducting polymer used was a blue electroluminescent copolymer of the following repeat units: 65 mol % 9,9-di-n-octylfluorene-2,7-diyl, 30 mol % 9,9-diphenylfluorene-2,7-diyl, and 5 mol % of the repeat unit "PFB" (represented below). The polymer was prepared by Suzuki polymerisation according to the method described in WO 00/53656.

"PFB"

For the purpose of comparison, an identical device was prepared except that the layer of F8-TFB was not deposited (i.e. exclusion of steps 2-4).

Despite the absence of cross-linking groups, the layer of F8-TFB is resistant to dissolution in xylene under the conditions typically employed for polymer deposition. Although dissolution of the F8-TFB layer in a solvent may be possible under forcing conditions, it will be appreciated that this layer is sufficiently resistant to dissolution to enable the formation of a plurality of electroactive organic layers. Without wishing to be bound by any theory, a possible mechanism for loss of solubility is an adhesion to the surface that the first semiconducting polymer is deposited onto.

Figure 2:
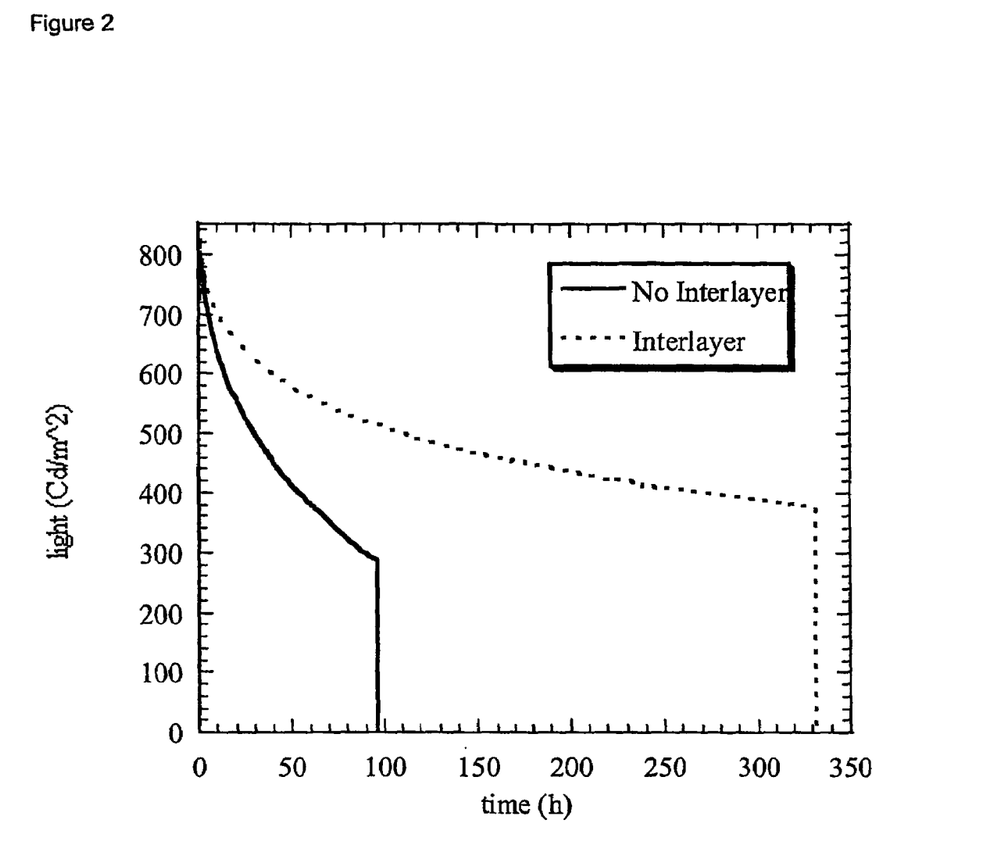
FIG. 2 shows a plot of luminance vs. time for a blue electroluminescent device

As can be seen from FIG. 2, the inclusion of an "interlayer" of F8-TFB results in a very significant increase in lifetime.

Without wishing to be bound by any theory, the improvement in lifetime may be due to the F8-TFB layer preventing electrons from flowing into the PEDT:PSS and/or anode (i.e. hole injection) layers.

Example 2

Blue Electroluminescent Device with Variation of Amine Content

A series of devices was prepared by following the procedure of example 1 except that the molar ratio of PFB repeat units within the polymer was varied from 2.5% up to 20% (the ratio of diphenylfluorene was kept constant at 30%; the change in PFB ratio was accommodated by increasing or decreasing the ratio of diphenylfluorene).

For the purpose of comparison, an identical series of devices was prepared except that the layer of F8-TFB was not deposited (i.e. exclusion of steps 2-4).

Figure 3:
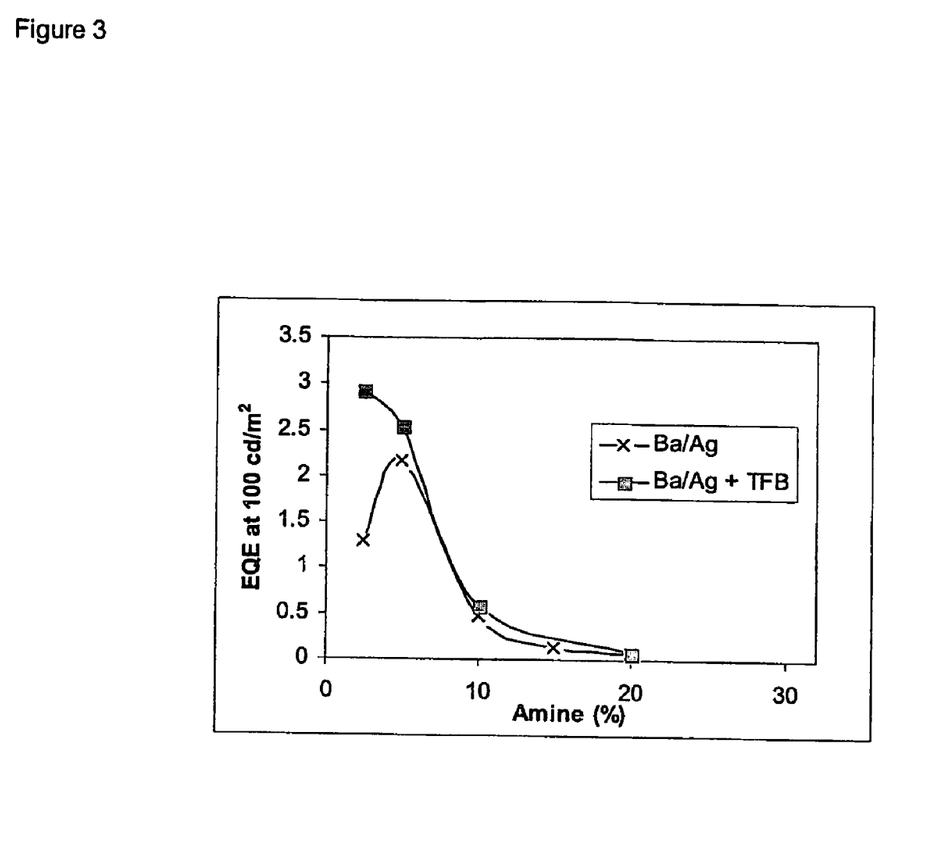
FIG. 3 shows a plot of external quantum efficiency vs. amine content for a series of blue electroluminescent devices

As can be seen from FIG. 3, the external quantum efficiency (EQE) of the device according to the invention is at least similar to, and at low PFB content significantly greater than, comparative devices wherein the layer of F8-TFB is absent.

Without wishing to be bound by any theory, it is believed that low amine content leads to superior device performance because barium is believed to be a relatively poor electron injector. Therefore, charge is balanced when the quantity of PFB repeat units, which are capable of transporting holes, is reduced. Similarly, selection of a good electron injector (for example dielectric materials, in particular fluorides such as lithium fluoride) may show optimal performance at higher molar ratios of amine.

Example 3

Red Electroluminescent Device

The procedure of Example 1 was followed, except that the organic semiconducting material used was a red electroluminescent polymer of the following repeat units: 50 mol % 9,9-di-n-octylfluorene-2,7-diyl, 17 mol % "TFB" repeat units (illustrated below), 30 mol % 1,3,2-benzothiadiazole-4,7-diyl, and 3 mol % 4,7-bis(2-thiophen-5-yl)-1,3,2-benzothiadiazole. Materials of this type are disclosed in WO 00/46321 and WO 00/55927, the contents of which are incorporated herein by reference.

"TFB"

Figure 4:
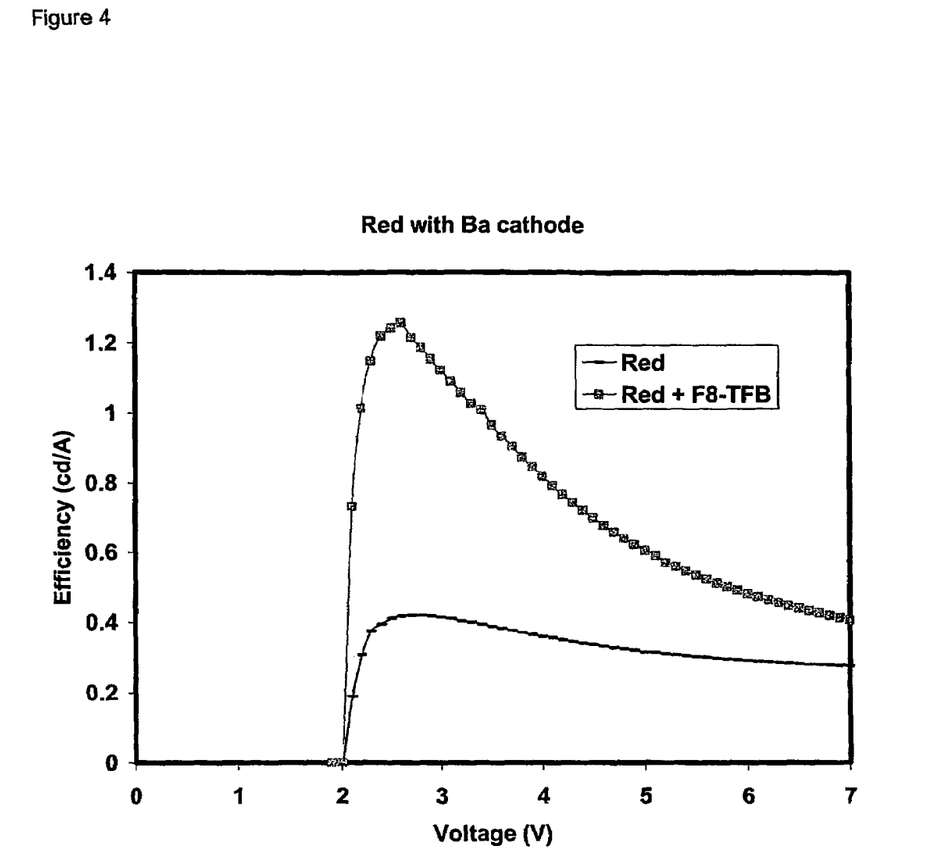
FIG. 4 shows a plot of efficiency vs. bias for a red electroluminescent device

FIG. 4 shows that efficiency of the device comprising a layer of F8-TFB is higher than the comparative device wherein this layer is absent. The improvement is most significant at low voltage.

Furthermore, lifetime of the red electroluminescent device was at least doubled as compared to the comparative device.

Example 4

Green Electroluminescent Device

Devices were prepared in accordance with the process of Example 1, except that the organic semiconducting material used was a green electroluminescent polymer as disclosed in, for example, WO 00/55927 and WO 00/46321.

As for the red and blue electroluminescent devices, substantial improvements were observed for both lifetime and efficiency as compared to a device not comprising the layer of F8-TFB.

It will be apparent that devices according to the invention show improvement for OLEDs across a wide range of colors and as such are particularly suitable full color displays, i.e. those comprising red, green and blue electroluminescent materials.

Although the present invention has been described in terms of specific exemplary embodiments, it will be appreciated that various modifications, alterations and/or combinations of features disclosed herein will be apparent to those skilled in the art without departing from the spirit and scope of the invention as set forth in the following claims.

The invention claimed is:

1. An optical device comprising
an anode;
a cathode comprising barium, strontium or calcium;
a layer of solution processable organic semiconducting copolymer comprising triarylamine repeat units between the anode and the cathode; and
a layer of cross-linked hole transporting and electron blocking material located between the anode and the layer of organic solution processable semiconducting copolymer,
wherein the molar ratio of triarylamine repeat units in the copolymer is between 1% and 10%.

2. An optical device according to claim 1 that is an electroluminescent device.

3. An optical device according to claim 2 that is a full color device wherein the layer of organic semiconducting copolymer comprises red, green and blue electroluminescent materials.

4. An optical device according to claim 1 wherein the cathode comprises barium.

5. An optical device according to claim 1 wherein the layer of cross-linked hole transporting and electron blocking material comprises a triarylamine.

6. An optical device according to claim 5 wherein the triarylamine of the cross-linked hole transporting and electron blocking material is provided as repeat units of a polymer.

7. An optical device according to claim 6 wherein the polymer is a copolymer comprising one or more arylene co-repeat units.

8. An optical device according to claim 7 wherein at least one of the arylene co-repeat units is selected from the group consisting of optionally substituted fluorene, spirofluorene, indenofluorene and phenylene.

9. An optical device according to claim 7 wherein at least one of the arylene co-repeat units is 9,9-disubstituted fluorene-2,7-diyl.

10. An optical device according to claim 6 wherein the triarylamine repeat unit of the cross-linked hole transporting and electron blocking polymer is selected from the group consisting of repeat units of formulae 1-6:

wherein X, Y, A, B, C, and D are independently selected from H or a substituent group.

11. An optical device according to claim 10, wherein at least one of X, Y, A, B, C, and D is independently selected from the group consisting of optionally substituted, branched or linear alkyl, aryl, perfluoroalkyl, thioalkyl, cyano, alkoxy, heteroaryl, alkylaryl and arylalkyl groups.

12. An optical device according to claim 1 wherein the semiconducting copolymer comprises repeat units selected from the group consisting of optionally substituted fluorene, spirofluorene, indenofluorene and phenylene.

13. An optical device according to claim 12 wherein the repeat units comprise 9,9-disubstituted fluorene-2,7-diyl.

14. An optical device according to claim 1 wherein said semiconducting copolymer comprises a repeat unit selected from triarylamine repeat units of formulae 1-6:

-continued

-continued wherein X, Y, A, B, C, and D are independently selected from H or a substituent group.

15. An optical device according to claim 14 wherein said copolymer comprises at least one co-repeat unit comprising a repeat unit of formula (I):

(I)

wherein each R is independently selected from the group consisting of H or optionally substituted, branched or linear alkyl, aryl, perfluoroalkyl, thioalkyl, cyano, alkoxy, heteroaryl, alkylaryl and arylalkyl groups.

16. An optical device according to claim 15 wherein at least one R is a $C_{1-10}$ alkyl group.

17. An optical device according to claim 15 wherein at least one R is a butyl group.

18. An optical device according to claim 1 wherein a layer of hole injecting material is located between the anode and the layer of hole transporting and electron blocking material.

19. An optical device according to claim 18 wherein the layer of hole injecting material is poly(ethylene dioxythiophene).

20. An optical device according to claim 1 wherein the cathode comprises elemental barium.

* * * * *